(12) United States Patent
Patomaki et al.

(10) Patent No.: US 11,778,927 B2
(45) Date of Patent: Oct. 3, 2023

(54) SILICON QUANTUM DEVICE STRUCTURES DEFINED BY METALLIC STRUCTURES

(71) Applicant: Quantum Motion Technologies Limited, London (GB)

(72) Inventors: Sofia Patomaki, Harrogate (GB); John Morton, Harrogate (GB)

(73) Assignee: QUANTUM MOTION TECHNOLOGIES LIMITED, London (GB)

( * ) Notice: Subject to any disclaimer, the term of this patent is extended or adjusted under 35 U.S.C. 154(b) by 0 days.

(21) Appl. No.: 18/008,896

(22) PCT Filed: Aug. 5, 2021

(86) PCT No.: PCT/EP2021/071850
§ 371 (c)(1),
(2) Date: Dec. 7, 2022

(87) PCT Pub. No.: WO2022/029217
PCT Pub. Date: Feb. 10, 2022

(65) Prior Publication Data
US 2023/0217840 A1 Jul. 6, 2023

(30) Foreign Application Priority Data
Aug. 7, 2020 (EP) .................................. 20190137

(51) Int. Cl.
*H03K 17/92* (2006.01)
*H10N 60/10* (2023.01)
*H10N 60/01* (2023.01)

(52) U.S. Cl.
CPC ........... *H10N 60/128* (2023.02); *H03K 17/92* (2013.01); *H10N 60/01* (2023.02); *H10N 60/11* (2023.02)

(58) Field of Classification Search
CPC ....................................................... H03K 17/92
(Continued)

(56) References Cited

U.S. PATENT DOCUMENTS

2002/0179897 A1   12/2002   Eriksson et al.
2015/0279981 A1   10/2015   Eriksson et al.
(Continued)

FOREIGN PATENT DOCUMENTS

EP   2 075 745 A1   7/2009

OTHER PUBLICATIONS

Notification of Transmittal of the International Search Report and the Written Opinion of the International Searching Authority, or the Declaration for International Application No. PCT/EP2021/071850 (dated Nov. 10, 2021).

*Primary Examiner* — Tomi Skibinski
(74) *Attorney, Agent, or Firm* — Jenkins, Taylor & Hunt, P.A.

(57) ABSTRACT

A silicon-based quantum device is provided. The device comprises: a first metallic structure (501); a second metallic structure (502) laterally separated from the first metallic structure; and an L-shaped elongate channel (520) defined by the separation between the first and second metallic structures; wherein the elongate channel has a vertex (505) connecting two elongate parts of the elongate channel. The device further comprises: a third metallic structure (518), mediator gate, positioned in the elongate channel; a fourth metallic structure (531) forming a first barrier gate, arranged at a first end of the third metallic structure; and a fifth metallic structure (532) forming a second barrier gate arranged at a second end of the third metallic structure. The first, second, third, fourth and fifth metallic structures are configured for connection to first, second, third, fourth and fifth electric potentials respectively. The first, second, fourth (Continued)

and fifth electric potentials are controllable to define an electrical potential well to confine quantum charge carriers in an elongate quantum dot beneath the elongate channel. The fourth and fifth electric potentials and the position of the fourth and fifth metallic structures define first and second ends of the elongate channel respectively. The width of the electrical potential well is defined by the position of the first and second metallic structures and their corresponding electric potentials; and the length of the electrical potential well is defined by the position of the fourth and fifth metallic structures and their corresponding electric potentials. The third electric potential is controllable to adjust quantum charge carrier energy levels in the electrical potential well.

20 Claims, 7 Drawing Sheets

(58) Field of Classification Search
USPC .......................................................... 327/527
See application file for complete search history.

(56) References Cited

U.S. PATENT DOCUMENTS

| 2016/0275410 A1 | 9/2016 | Rogge et al. |
| 2017/0147939 A1 | 5/2017 | Dzurak et al. |
| 2019/0130298 A1* | 5/2019 | Pioro-Ladriere ........................... H01L 31/035236 |
| 2020/0052101 A1 | 2/2020 | Petta et al. |

* cited by examiner

SILICON QUANTUM DEVICE STRUCTURES DEFINED BY METALLIC STRUCTURES

FIELD OF THE INVENTION

The present invention relates to a silicon-based quantum device for quantum computation.

BACKGROUND TO THE INVENTION

Quantum computations typically require large numbers of qubits. In the near-term intermediate-scale quantum computing, or NISQ, era, quantum computational processes may use 50-100 qubits. Qubits are typically arranged in dense arrays within a quantum device so as to minimise the necessary processor size.

It is desirable to be able to address each qubit with an individual electrode to allow an experimentalist to manipulate the qubits within the device. However, the routing of electrodes used to address the qubits typically requires space comparable to or larger than the space occupied by the qubits alone, within the qubit array or qubit lattice. For planar qubit lattice layouts, the qubits therefore need to be spaced out in order to have enough space to pattern the electrodes.

It has been suggested that routing can be performed vertically, using a conductive via which extends perpendicular to the surface of the device. However, this is a complex method with a large number of processing steps and a high failure rate.

It is desirable to create a scalable device structure for use in quantum computing.

SUMMARY OF THE INVENTION

An aspect of the invention provides a silicon-based quantum device comprising a first metallic structure and a second metallic structure laterally separated from the first metallic structure. The device comprises an elongate channel defined by the separation between the first and second metallic structures; the elongate channel has a vertex. The device comprises a third metallic structure which is positioned partially in the elongate channel. The device further comprises a fourth metallic structure arranged at a first end of the third metallic structure and a fifth metallic structure arranged at a second end of the third metallic structure. The first, second, third, fourth and fifth metallic structures are configured for connection to first, second, third, fourth and fifth electric potentials respectively, and the first, second, third, fourth and fifth electric potentials are controllable to define an electrical potential well to confine quantum charge carriers in an elongate quantum dot beneath the elongate channel. The fourth and fifth electric potentials and the position of the fourth and fifth metallic structures define first and second ends of the elongate channel respectively. The width of the electrical potential well is defined by the position of the first, second and third metallic structures and their corresponding electric potentials; and the length of the electrical potential well is defined by the position of the third, fourth and fifth metallic structures and their corresponding electric potentials. The third electric potential is controllable to adjust quantum charge carrier energy levels in the electrical potential well.

This device provides a quasi-one-dimensional channel with improved confinement of quantum charge carriers. The quasi-one-dimensional channel extends around a corner. The charge carriers may for example be electrons or holes. The elongate channel can support an elongated quantum dot having a vertex which can advantageously be used to couple laterally separated conductive regions of the device. Beneficially, the elongated quantum dot which extends around a corner can be used to fabricate two dimensional arrays whilst only using planar routing. The device also beneficially provides improved control over the charge carrier occupation within the electrical potential well.

The presence of first and second metallic structures either side of the third metallic structure provides improved individual control of the shape of the channel and the chemical potential levels within the potential well.

Advantageously, this device provides the capability for different structures within the device to be brought into resonance.

Advantageously, the fourth and fifth electric potentials may be configured such that the fourth and fifth metallic structures form an electrostatic barrier to define the length of the elongate channel together with the third metallic structure. The width of the elongate channel is typically defined using the first, second and third metallic structures.

Furthermore, the application of first and second electric potentials to the first and second metallic structures respectively reduces the effect of the application of the fourth and fifth electric potentials on the shape of the elongate channel. Advantageously, the shape of the elongate channel is primarily controlled using the first and second electric potentials.

The device comprises an elongate channel which has a vertex. The third metallic structure is positioned partially in the elongate channel and therefore typically the third metallic structure extends around the vertex. This has an advantage that the device structure can be scaled up to couple conductive regions arranged in a two dimensional array. Typically the outer edges of the third metallic structure substantially align with the inner edges of the elongate channel.

The first, second, third, fourth and fifth metallic structures are configured for connection to respective electric potentials which are controllable to define an electrical potential well to confine quantum charge carriers in an elongate quantum dot beneath the elongate channel. The first, second, third, fourth and fifth metallic structures define the width and length of the electrical potential well. Therefore the elongate quantum dot typically extends around the vertex. This has an advantage that an elongate quantum dot having a vertex can be used as a mediator dot between conductive regions in a two dimensional array where a straight elongate quantum dot would not be suitable. The configuration provides a mediation mechanism compatible with planar routing.

Typically the device further comprises a substrate beneath the first, second and third metallic structures. The substrate may comprise an isotopically purified silicon layer, for example silicon-28. The substrate may further comprise additional silicon layers beneath the silicon-28 layer. The device is preferably a silicon metal oxide semiconductor (SiMOS) device.

The first, second, third, fourth and fifth electric potentials are preferably configured to define the dimensions and charge carrier occupation of the electrical potential well. Preferably, the polarity of the first and second electric potentials is opposite to the polarity of the third electric potential.

Typically, the first electric potential is substantially the same as the second electric potential. The first and second electric potentials preferably define first and second walls of the electrical potential well. The use of similar or the same electric potentials to define the first and second walls results in a substantially symmetrical electrical potential well which advantageously provides a more uniform confinement region. This may be achieved by providing electrical contact between the first and second metallic structures or providing them in a common layer.

Optionally, the fourth electric potential is substantially the same as the fifth electric potential. This may provide an advantage of uniformity of quantum charge carrier confinement. In another example, the fourth electric potential and the fifth electric potential may be different. The fourth and fifth electric potentials affect the height of the electric potential barrier at the first and second ends of the elongate channel. The fourth and fifth electric potentials may be altered to change the barrier height and accordingly the tunnelling strength in and out of the electrical potential well. Advantageously this allows an experimentalist to manipulate the quantum charge carriers as desired.

The first and second metallic structures typically extend to an outer region of the device. In the outer region, the first and second metallic structures can be connected to a voltage source which is configured to supply a potential bias.

The magnitude and polarity of the bias can be selected according to the desired characteristics of the device and specifically the electrical potential well.

The first metallic structure and the second metallic structure may be connected to two separate voltage sources or may be connected to the same voltage source. Optionally, if the first and second metallic structures are connected to the same voltage source, the first and second metallic structures may form a single structure with first and second limbs such that the first and second metallic structures are positioned either side of the elongate channel. In this case, the use of a single structure to form both the first metallic structure and the second metallic structure ensures the electrical connection between the two. Optionally, if the first metallic structure and the second metallic structure are connected to two separate voltage sources, the set voltage may nevertheless be selected to be the same on each of the voltage sources.

Advantageously, if the first and second electric potentials are substantially the same, the walls of the electrical potential well will be substantially symmetrical and will thus provide good confinement.

Optionally, the first and second metallic structures are arranged in a first metallic layer. A plurality of metallic structures may be deposited simultaneously so as to form a single layer in which each structure, separated laterally, is approximately the same thickness. This advantageously reduces the number of steps required to manufacture the device. The third metallic structure may be arranged in a second metallic layer.

Preferably, the device further comprises an electrically insulating layer between the first metallic layer and the second metallic layer and overlying the first metallic layer. This beneficially provides an electrical separation between the metallic layers which allows the first, second and third metallic structures to be connected to different electric potentials.

Optionally, the fourth and fifth metallic structures may be arranged in a third metallic layer. Preferably, the device further comprises another electrically insulating layer between the second metallic layer and the third metallic layer. Advantageously the presence of electrically insulating layers in between metallic layers separates the conducting regions which adds flexibility to the device structure.

Typically, each of the first metallic layer and the second metallic layer comprises a plurality of laterally separated metallic structures. Optionally, the third metallic layer comprises a plurality of laterally separated metallic structures. The use of multiple metallic structures in one or more of the metallic layers provides additional flexibility to the device structure.

The second metallic layer may further comprise a sixth metallic structure configured for connection to a sixth electric potential. Preferably, a reservoir of charge carriers can be supported beneath the sixth metallic structure. The reservoir may be couplable to the electrical potential well by proximity. The strength of coupling may be determined by a modifiable electric potential barrier, the height of which may be modified by one or more of the plurality of metallic structures in the third metallic layer for example. Advantageously, the coupling of the reservoir to the potential well improves charge stability of the potential well.

The second metallic layer may further comprise a seventh metallic structure configured for connection to a seventh electric potential. Preferably, a quantum dot can be supported beneath the seventh metallic structure. The quantum dot may be couplable to the electrical potential well by proximity. The strength of coupling may be determined by a modifiable electric potential barrier, the height of which may be modified by one or more of the plurality of metallic structures in the third metallic layer for example. Additional quantum dots may be supported beneath additional metallic structures in the second metallic layer. For example, a first quantum dot may be supported near the first end of the electrical potential well and a second quantum dot may be supported near the second end of the electrical potential well. Advantageously, the electrical potential well may be used to communicate quantum information between the first and second quantum dots.

The device may comprise additional metallic structures which can each be configured to induce a quantum dot. The device may therefore be suitable for supporting an array of quantum dots which may be used as qubits in quantum computations. Each quantum dot in the array of quantum dots may be coupled to another quantum dot, an electrical potential well, or a charge carrier reservoir. The device advantageously provides a mechanism for coupling quantum dots and for individually addressing large numbers of quantum dots in a single device.

Preferably, the device further comprises one or more implanted regions. For example, a metallic structure in the second metallic layer may partially overly one of the one or more implanted regions. This advantageously results in ohmic contact between the metallic structure and the substrate. The implanted region typically comprises a group V ion such as phosphorus ($P^+$). The metallic structure may for example be configured to support a quantum charge carrier reservoir or a quantum dot.

The first and second metallic structures are laterally separated, defining the elongate channel in between. The third metallic structure is positioned partially in the elongate channel. The elongate channel is preferably longer than it is wide and has a vertex. Preferably, a first portion of the channel is angled with respect to a second portion of the channel. In this way the channel, and the consequent elongate quantum dot formed beneath the third metallic structure, extends around a corner. Advantageously, this configuration provides a mechanism for fabricating two dimensional arrays whilst only using planar routing.

Each of the metallic structures is typically configured for connection to a respective electric potential, defining an electric potential topography across the device. Typically, each of the metallic structures extends to an outer region of the device where they can be connected to a voltage source which can be used to supply a particular potential bias. In particular, the third metallic structure may comprise a first extension, wherein the first extension partially overlies the first metallic structure. The first extension may be configured for connection to the third electric potential and typically connects the portion of the third metallic structure positioned within the elongate channel and the voltage source.

The third metallic structure may further comprise a second extension which partially overlies the first metallic structure. The first and/or second extension may be configured for connection to the third electric potential. The use of two extensions advantageously provides a mechanism for troubleshooting the device, by using the first extension to connect the third metallic structure to the third electric potential and using the second extension to check the correct function of the first extension.

Another aspect of the invention provides a method of manufacturing a silicon-based quantum device. The method comprises: depositing a first metallic structure; depositing a second metallic structure laterally separated from the first metallic structure such that an elongate channel is defined by the separation between the first and second metallic structures; wherein the elongate channel has a vertex; depositing a third metallic structure partially in the elongate channel; depositing a fourth metallic structure at a first end of the third metallic structure; depositing a fifth metallic structure at a second end of the third metallic structure; wherein the first, second, third, fourth and fifth metallic structures are configured for connection to first, second, third, fourth and fifth electric potentials respectively; wherein the first, second, third, fourth and fifth electric potentials are controllable to define an electrical potential well to confine quantum charge carriers in an elongate quantum dot beneath the elongate channel. The fourth and fifth electric potentials and the position of the fourth and fifth metallic structures define first and second ends of the elongate channel respectively. The width of the electrical potential well is defined by the position of the first, second and third metallic structures and their corresponding electric potentials; and the length of the electrical potential well is defined by the position of the third, fourth and fifth metallic structures and their corresponding electric potentials. The third electric potential is controllable to adjust quantum charge carrier energy levels in the electrical potential well.

Advantageously, this method of manufacturing a silicon-based device provides a confinement region in which quantum charge carriers can be confined. The elongate channel can support an elongated quantum dot which can advantageously be used to couple laterally separated conductive regions of the device such as charge carrier reservoirs or quantum dots.

Typically, depositing the third metallic structure partially in the elongate channel comprises depositing the third metallic structure extending around the vertex. The third metallic structure is preferably partially deposited in the elongate channel and partially deposited overlying the first metallic structure. Typically the first, second, fourth and fifth metallic structures define the extent of the elongate channel. The portion of the third metallic structure deposited in the elongate channel typically substantially fills the elongate channel. For example, edges of the third metallic structure may overly or abut the edges of one or more of the first, second, fourth and fifth metallic structures. An advantage of depositing the third metallic structure extending around the vertex is the ability to manufacture a device that can support a two dimensional array of quantum dots using planar routing.

As a consequence of a third metallic structure being deposited extending around the vertex, the elongate quantum dot typically extends around the vertex. An advantage of this is the ability to mediate interactions around a corner in a quantum device.

Preferably, the first and second metallic structures are deposited simultaneously as part of a first metallic layer. The deposition of the first and second metallic structures in the same fabrication step advantageously reduces the number of fabrication steps required to manufacture the device and therefore reduces the manufacturing complexity. The third metallic structure may be deposited as part of a second metallic layer following the deposition of the first metallic layer.

The first and second metallic structures are preferably deposited on a silicon substrate to create a silicon metal oxide semiconductor (SiMOS) device.

The method typically further comprises depositing a first electrically insulating layer after depositing the first metallic layer and before depositing the second metallic layer. The first electrically insulating layer preferably overlies the first metallic layer. This advantageously electrically separates the first and second metallic structures from the third metallic structures, allowing the first and second electric potentials to differ from the third electric potential.

After the deposition of the second metallic layer, the fourth and fifth metallic structures are preferably deposited simultaneously as part of a third metallic layer. The method typically further comprises depositing a second electrically insulating layer after depositing the second metallic layer and before depositing the third metallic layer, wherein the second electrically insulating layer overlies the second metallic layer.

The method preferably further comprises creating one or more implanted regions in the silicon substrate before metal deposition. For example, phosphorus ions may be implanted to create negatively doped regions in the device. A metallic structure in the second metallic layer may be positioned such that a portion of the metallic structure extends to cover or partially cover one of the one or more implanted regions. Advantageously this results in ohmic contact between the metallic structure and the substrate.

A further aspect of the invention provides a method of operating a silicon-based quantum device. The method comprises: applying a first electric potential to a first metallic structure; applying a second electrical potential to a second metallic structure, wherein the second metallic structure is laterally separated from the first metallic structure such that an elongate channel is defined by the separation between the first and second metallic structures; wherein the elongate channel has a vertex; applying a third electric potential to a third metallic structure, wherein the third metallic structure is positioned partially in the elongate channel; applying a fourth electric potential to a fourth metallic structure arranged at a first end of the third metallic structure; applying a fifth electric potential to a fifth metallic structure arranged at a second end of the third metallic structure; and controlling the third electric potential to adjust quantum charge carrier energy levels in the electrical potential well. The first, second, third, fourth and fifth metallic structures are configured for connection to first, second, third, fourth and fifth electric potentials respectively. The first, second, third, fourth and fifth electric potentials are controllable to define an electrical potential well to confine quantum charge carriers in an elongate quantum dot beneath the elongate channel; and the fourth and fifth electric potentials and the position of the fourth and fifth metallic structures define first and second ends of the elongate channel respectively. The width of the electrical potential well is defined by the position of the first, second and third metallic structures and their corresponding electric potentials; and the length of the electrical potential well is defined by the position of the third, fourth and fifth metallic structures and their corresponding electric potentials.

Advantageously, this method can be used to operate a two dimensional array of quantum dots whilst only using planar routing.

Typically, the third metallic structure extends around the vertex. The third electric potential is applied to the third metallic structure and the third electric potential can be controlled to adjust quantum charge carrier energy levels in the electrical potential well. Advantageously, when the third metallic structure has a vertex, the third electric potential can be controlled to define an electrical potential well having a vertex. This can be used to operate a device which supports a two dimensional array of quantum dots.

Consequently, the elongate quantum dot typically extends around the vertex. Advantageously, an elongate quantum dot extending around a vertex can be used to mediate interactions around a corner.

Preferably the polarity of the first and second electric potentials is opposite to the polarity of the third electric potential. Advantageously this enhances the confinement of quantum charge carriers in the elongate quantum dot. The first and second metallic structures and the corresponding electric potentials typically provide electrostatic barriers on each side of the third metallic structure. The third metallic structure and the third electric potential preferably provide a plunger gate.

Typically, the first electric potential is substantially the same as the second electric potential. The first and second electric potentials preferably define first and second walls of the electrical potential well. The use of similar or the same electric potentials to define the first and second walls results in a substantially symmetrical electrical potential well which advantageously provides a more uniform confinement region. This may be achieved by providing electrical contact between the first and second metallic structures or providing them in a common layer.

Optionally, the fourth electric potential is substantially the same as the fifth electric potential. This may provide an advantage of uniformity of quantum charge carrier confinement. In another example, the fourth electric potential and the fifth electric potential may be different. The fourth and fifth electric potentials affect the height of the electric potential barrier at the first and second ends of the elongate channel. The fourth and fifth electric potentials may be altered to change the barrier height and accordingly the tunnelling strength in and out of the electrical potential well. Advantageously this allows an experimentalist to manipulate the quantum charge carriers as desired.

Another aspect of the invention provides a silicon-based quantum device comprising a first metallic structure, a second metallic structure and a third metallic structure. The first metallic structure is configured for connection to a first electric potential. The second metallic structure is configured for connection to a second electric potential. The third metallic structure, positioned at least partially in an elongate channel between the first and second metallic structures, is configured for connection to a third electric potential so that an electrical potential well is defined by the electric potentials of the first, second and third metallic structures to confine quantum charge carriers beneath the elongate channel. The third electric potential is controllable to adjust quantum charge carrier energy levels in the electrical potential well.

A further aspect of the invention provides a method of manufacturing a silicon-based quantum device. The method comprises: depositing first and second metallic structures; and depositing a third metallic structure at least partially in an elongate channel between the first and second metallic structures; wherein the first, second and third metallic structures are configured for connection to first, second and third electric potentials respectively so that an electrical potential well is defined by the first, second and third electric potentials to confine quantum charge carriers beneath the elongate channel. The third electric potential is controllable to adjust quantum charge carrier energy levels in the electrical potential well.

BRIEF DESCRIPTION OF THE DRAWINGS

Embodiments of the invention will now be described with reference to the accompanying drawings in which.

DETAILED DESCRIPTION

Figure 1A:
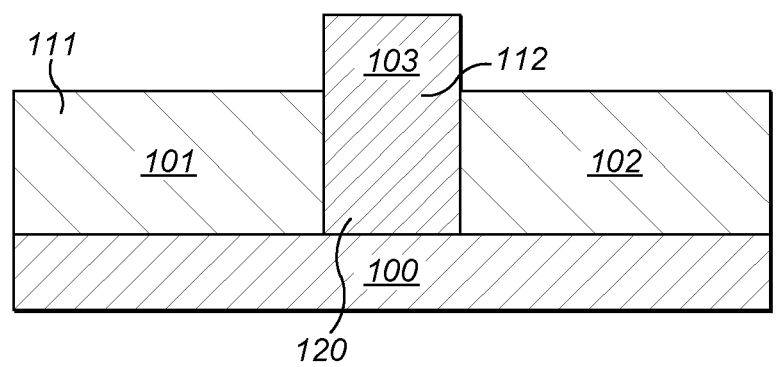
FIG. 1A is a cross-sectional side view of a silicon-based quantum device in accordance with a first embodiment of the invention.
Figure 1B:
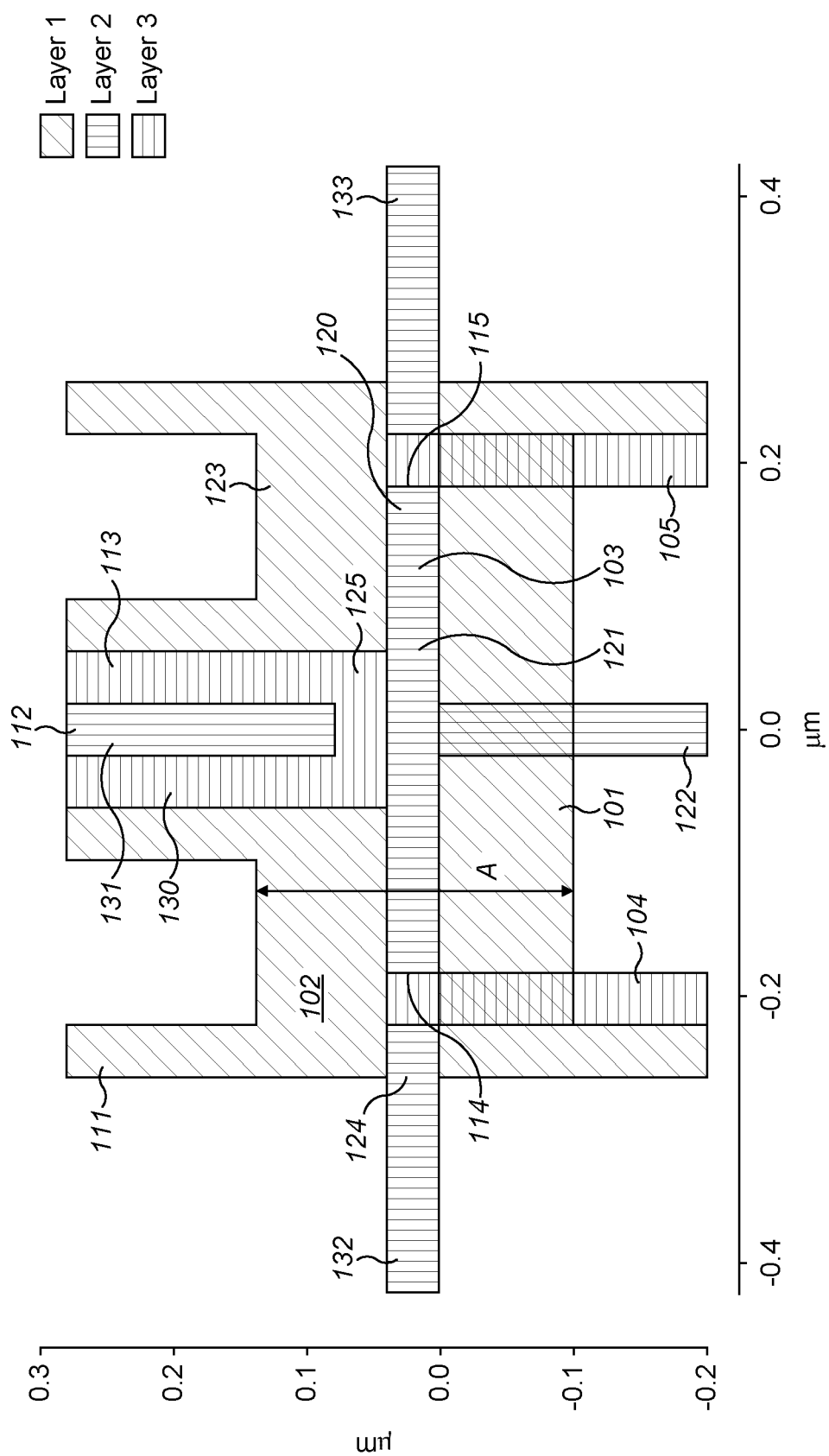
FIG. 1B is a top view of a silicon-based quantum device in accordance with the first embodiment of the invention.

FIGS. 1A and 1B schematically illustrate a cross-sectional side view and a top view of a silicon-based quantum device according to a first embodiment. The silicon-based quantum device is made using silicon metal-oxide semiconductor, or SiMOS, fabrication processes. The cross-sectional side view depicted in FIG. 1A is along the direction A indicated in FIG. 1B.

FIG. 1A shows a first metallic structure 101, a second metallic structure 102 and a third metallic structure 103 on a silicon substrate 100. In this embodiment, the first and second metallic structures 101, 102 are deposited simultaneously, i.e. in the same processing step, and are therefore approximately the same thickness. The first and second metallic structures 101, 102 are arranged in a first metallic layer 111. The first and second metallic structures 101, 102 are laterally separated within the first metallic layer 111, forming an elongate channel 120 between them.

The third metallic structure 103 is deposited partially in the elongate channel 120 between the first metallic structure 101 and the second metallic structure 102. The third metallic structure 103 is arranged in a second metallic layer 112. An electrically insulating layer (not shown) is deposited between the first metallic layer 111 and the second metallic layer 112. The electrically insulating layer may be formed from any suitable material such as alumina or any high-k dielectric.

Each of the first, second and third metallic structures 101, 102 and 103 are deposited on the silicon substrate 100, the top layer of which is isotopically purified silicon, silicon-28 in this embodiment. The first, second and third metallic structures 101, 102 and 103 may be formed from any suitable metal such as gold or tungsten. Each of the first and second metallic layers 111, 112 may comprise multiple layers. For example one of the first or second metallic layers 111, 112 may comprise a layer of titanium followed by a layer of gold. The deposition of metal may be performed using any suitable technique such as atomic layer deposition or chemical vapour deposition.

FIG. 1B schematically illustrates a top view of the silicon-based quantum device shown in FIG. 1A. The first metallic layer 111 includes a plurality of metallic structures including the first metallic structure 101 and the second metallic structure 102. The first and second metallic structures 101, 102 in the first metallic layer 111 are configured for connection to first and second electric potentials respectively. The first and second electric potentials may be substantially the same, and may be tuned to form confinement regions in the device by forming an electrostatic potential barrier.

The second metallic layer 112 includes a plurality of metallic structures including the third metallic structure 103. A first portion 121 of the third metallic structure 103 is positioned in the elongate channel 120 between the first and second metallic structures 101, 102 and a second portion 122 of the third metallic structure 103 is positioned partially overlying the first metallic structure 101. The width of the first metallic structure 101, which defines the level of overlap between the second portion 122 of the third metallic structure 103 and the first metallic structure 101, can be adjusted according to fabrication considerations. The first metallic structure 101 should be wide enough to provide adequate confinement and narrow enough to reduce the likelihood of a defect in the electrically insulating layer between the first and third metallic structures 101, 103. For example, the first metallic structure 101 may be between 10 and 400 nanometres when using planar routing, or between 10 and 50 nanometres when using non-planar routing. The second portion 122 of the third metallic structure 103 is a first extension which extends to an outer region of the device and is configured for connection to a third electric potential. The third metallic structure 103 in this embodiment is 'T' shaped, when viewed from above.

The third metallic structure 103 acts as a plunger gate, and the first, second and third electric potentials are tuned such that an electrical potential well is defined beneath the elongate channel 120. The electrical potential well beneath the elongate channel 120 is an elongated quantum dot, or a mediator quantum dot. The presence of the first and second metallic structures 101, 102 on either side of the third metallic structure 103 provides improved control of the confinement shape of the elongated quantum dot beneath the elongate channel 120.

Quantum charge carriers such as electrons or holes can be confined in the elongated quantum dot. The third electric potential has the opposite polarity to the first and second electric potentials and can be adjusted to control the number of charge carriers in the elongated quantum dot. For example, if the first and second electric potentials are negative, the third electric potential is positive. Altering the third electric potential has the effect of shifting the depth of the electrical potential well and correspondingly shifting the quantum charge carrier energy levels within the potential well. This can be used to modify the number of quantum charge carriers confined within the elongated quantum dot.

A fourth metallic structure 104 and a fifth structure 105 form barrier gates. In this embodiment, the fourth and fifth metallic structures 104, 105 are deposited simultaneously and form part of a third metallic layer 113. The third metallic layer 113 comprises a plurality of metallic structures. The fourth and fifth metallic structures 104, 105 are configured for connection to fourth and fifth electric potentials respectively. The fourth and fifth electric potentials are chosen such that the fourth and fifth metallic structures 104, 105 define a first end 114 and a second end 115 of the elongate channel 120 respectively by forming potential barriers. The fourth and fifth electric potentials can be controlled to adjust the height of the potential barriers at the respective ends of the elongate channel 120.

The electrical potential well, positioned beneath the elongate channel 120, is accordingly defined by the first, second, third, fourth and fifth metallic structures 101-105 and their corresponding electric potentials. The width of the electrical potential well is defined by the first, second and third metallic structures 101-103 and electric potentials; the length of the electrical potential well is defined by the third, fourth and fifth metallic structures 103-105 and electric potentials.

In this embodiment, the fabrication of the device includes depositing the first metallic layer 111, depositing a first electrically insulating layer (not shown) over the first metallic layer 111, depositing the second metallic layer 112, depositing a second electrically insulating layer (not shown) over the second metallic layer 112, and depositing the third metallic layer 113. In this way, the first, second and third metallic layers 111, 112, 113 are electrically separated. In an alternative embodiment, the third metallic layer is deposited before the second metallic layer, with an electrically insulating layer positioned between each metallic layer. Each electrically insulating layer is configured to cover a previously deposited, and thus exposed, metallic layer. Each electrically insulating layer may partially cover the exposed metallic layer. Importantly, each electrically insulating layer is deposited such that each metallic layer is electrically separated from each of the other metallic layers. There is no galvanic contact between the metallic layers and therefore charge carriers do not flow between vertically stacked metallic layers.

In this embodiment, the second metallic layer 112 further comprises three additional metallic structures acting as plunger gates. A first plunger gate 131 is suitable for supporting a reservoir of charge carriers. A second plunger gate 132 forms a source of quantum charge carriers and a third plunger gate 133 forms a drain for quantum charge carriers. In an alternative embodiment, the second plunger gate may form a drain for quantum charge carriers and the third plunger gate may form a source of quantum charge carriers.

Each of the first, second and third plunger gates 131, 132, 133 are deposited at the same time as the third metallic structure in this embodiment, and are each configured for connection to respective electric potentials. The electric potentials may be adjusted according to the required device function. For example, there may be a potential difference between the electric potential on the second plunger gate and the electric potential on the third plunger gate such that the movement of charge carriers is in a particular direction. Each of the first, second and third plunger gates 131, 132, 133 are positioned to partially overly an implanted region (not shown) of the device. The implanted region comprises ions such as phosphorus ions and is typically positioned in an outer region of the device.

The fourth metallic structure 104 in the third metallic layer 113 is positioned between the first end 114 of the third metallic structure 103 and the second plunger gate 132 of the second metallic layer 112. The fifth metallic structure 105 in the third metallic layer 113 is positioned between the second end 115 of the third metallic structure 103 and the third plunger gate 133 of the second metallic layer 112. The fourth and fifth metallic structures 104, 105 are partially positioned in a channel between two metallic structures of the first metallic layer 111, and partially positioned overlying the first metallic structure 101. Adjusting the fourth and fifth electric potentials adjusts the height of the potential barriers formed beneath the fourth and fifth metallic structures which controls the tunnel coupling between adjacent electrical potential wells. In this embodiment, adjusting the electric potential on the barrier gates 104, 105 controls the strength of the coupling between the metallic structures in the third metallic layer, namely the second plunger gate 132, the third metallic structure 103 and the third plunger gate 133.

The third metallic layer 113 comprises barrier gates including the fourth metallic structure 104 and the fifth metallic structure 105. The third metallic layer 113 further comprises an additional barrier gate, a first barrier gate 130, which is positioned between the first plunger gate 131 and the third metallic structure 103. The first barrier gate 130 is configured for connection to a barrier potential which can be adjusted to control the coupling strength between the reservoir of charge carriers, supported beneath the first plunger gate 131, and the elongated quantum dot supported beneath the third metallic structure 103.

The first metallic layer comprises an additional metallic structure: a first confinement gate, 123. A first channel 124 is formed between the first metallic structure 101 and the first confinement gate 123 and the second metallic structure 102. The second plunger gate 132, the fourth metallic structure 104, the third metallic structure 103, the fifth metallic structure 105 and the third plunger gate 133 are all partially positioned within the first channel 124. The elongate channel 120 beneath which quantum charge carriers can be confined forms a portion of the first channel 124. A second channel 125 is formed between the second metallic structure 102 and the first confinement gate 123. The first barrier gate 130 and the first plunger gate 131 are positioned partially within the second channel 125.

Each of the metallic structures is configured for connection to a respective electric potential. In this way, an electric potential topography is built up on the surface of the device, across which quantum charge carriers can be manipulated and guided. Each of the metallic structures extends out to an outer region of the device to a bonding region, which can be used to connect the metallic structure to a voltage source. The metallic structures in the first metallic layer remain substantially adjacent to the metallic structures in the second metallic layer even in the outer region of the device to minimise the presence of unwanted charge carriers. However, a small separation may be introduced between the metallic structures of the first and second metallic layers in order to avoid defects in the underlying substrate. The metallic structures in the first metallic layer can be used to screen electric potentials arising from the metallic structures in the second and/or third metallic layers.

Quantum charge carriers are confined within electrical potential wells beneath the third metallic structure 103, and the first, second and third plunger gates 131, 132, 133. The fourth and fifth metallic structures 104, 105 and the first barrier gate 130 form potential barriers, and the first and second metallic structures 101, 102 and the first confinement gate 123 form potential wells. The electric potentials are adjustable during operation in order to move charge carriers within the device. In particular, the electric potentials of the metallic structures 104, 105, 130 in the third metallic layer 113 can be adjusted to control the strength of coupling between neighbouring charge carrier confinement regions, and the electric potentials of the metallic structures 103, 131, 132, 133 in the second metallic layer 112 can be controlled to adjust the quantum charge carrier energy levels in the electrical potential wells or confinement regions, thus adjusting the quantum charge carrier occupancy.

Figure 2:
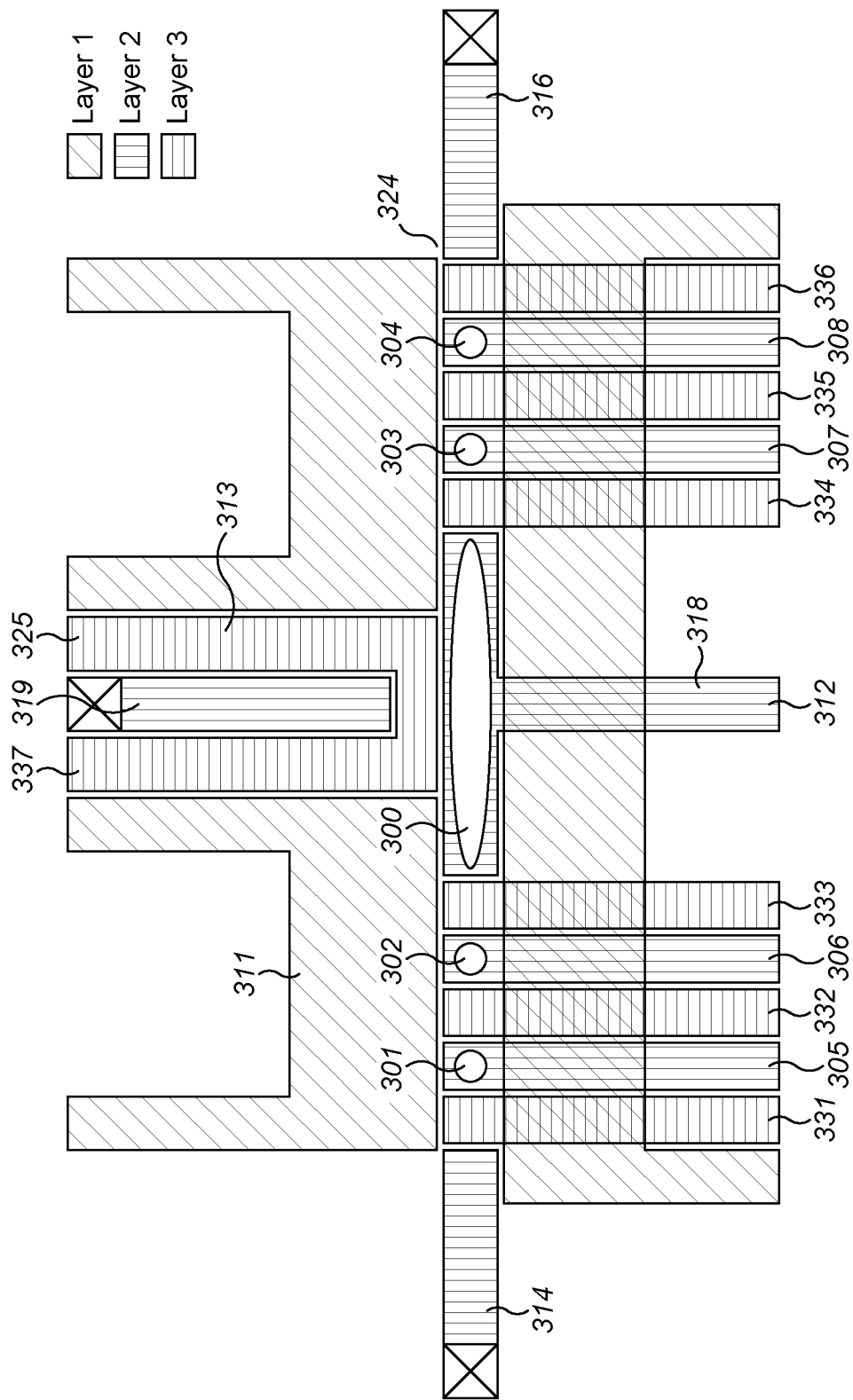
FIG. 2 is a top view of a silicon-based quantum device.

FIG. 2 schematically illustrates a top view of a silicon-based quantum device. A first metallic layer 311 comprises a plurality of confinement gates which define a first channel 324 and a second channel 325. A second metallic layer 312 comprises a plurality of plunger gates including a source gate 314, a drain gate 316, a mediator gate 318 and a reservoir gate 319. A third metallic layer 313 comprises a plurality of barrier gates.

The first channel 324 includes a portion of the source gate 314, the drain gate 316, the mediator gate 318, four quantum dot gates 305, 306, 307, 308 and six barrier gates 331, 332, 333, 334, 335, 336. Each plunger gate 305-308, 314, 316, 318 is separated by a barrier gate 331-336. The electric potential of the barrier gates 331-336 can be adjusted to control the strength of the coupling between adjacent plunger gates. The electric potentials of the plunger gates, in use, are configured such that an electrical potential well is defined beneath the plunger gates within the first channel.

The second channel 325 includes a portion of the reservoir gate 319 surrounded by a seventh barrier gate 337. The electric potential of the seventh barrier gate 337 can be tuned to adjust the strength of the coupling between the reservoir and the elongated quantum dot supported beneath the mediator gate 318.

The source gate 314, the drain gate 316 and the reservoir gate 319 extend to a doped region to provide ohmic contact.

The portion of the device shown in FIG. 2 illustrates four quantum dots 301, 302, 303, 304. Neighbouring quantum dots, i.e. the first and second quantum dots 301, 302 and the third and fourth quantum dots 303, 304, can interact. The second and third quantum dots 302, 303 can also interact using the elongated quantum dot 300 which acts as a mediator.

Figure 3:
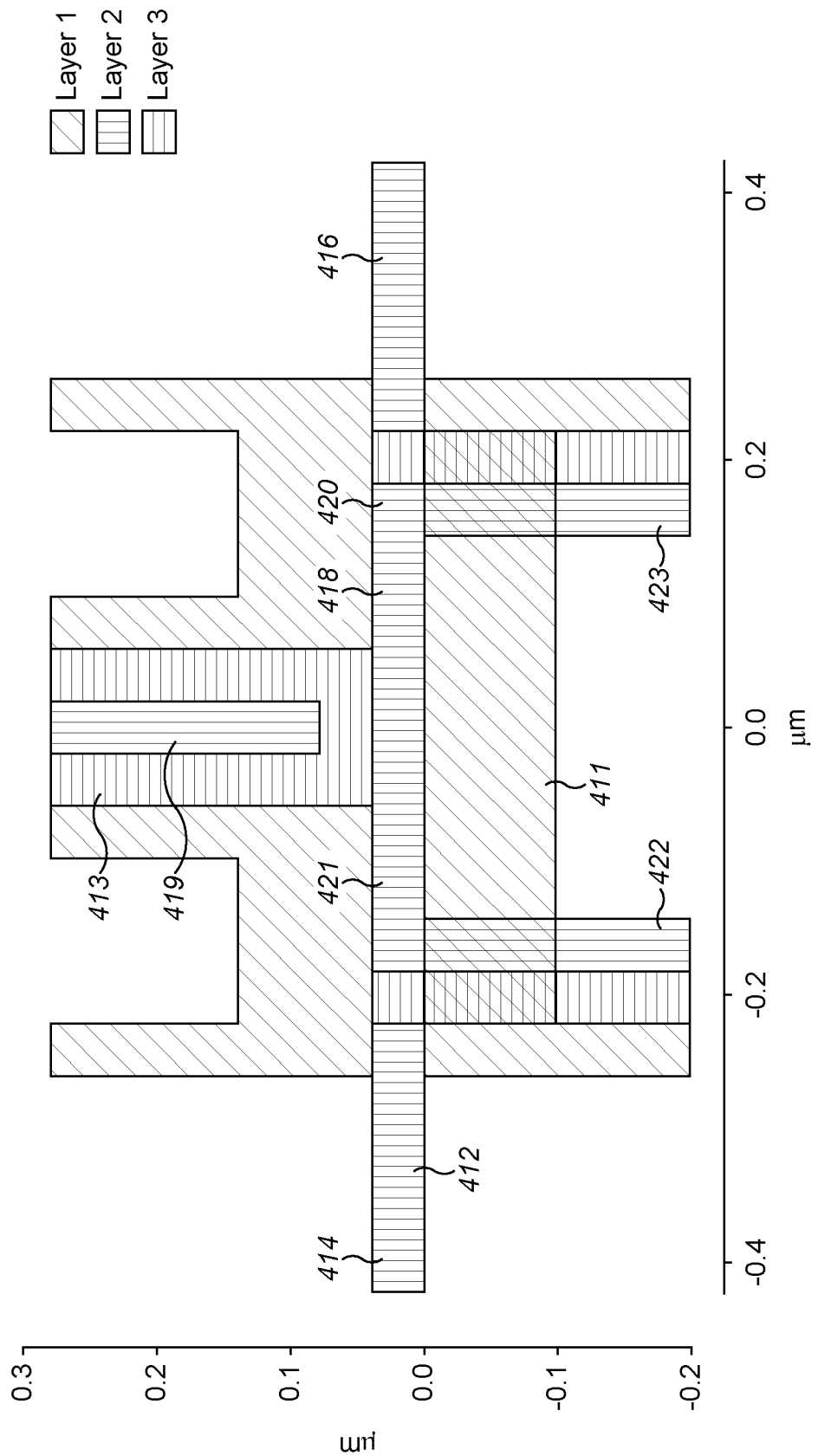
FIG. 3 is a top view of a silicon-based quantum device.

FIG. 3 schematically illustrates a top view of a silicon-based quantum device. The device is similar to the device shown in FIG. 1B. A first metallic layer 411 has metallic structures which form confinement gates defining channels. A second metallic layer 412 has metallic structures which form plunger gates including a source gate 414, a drain gate 416, a mediator gate 418 and a reservoir gate 419. A third metallic layer 413 has metallic structures which form barrier gates separating the mediator gate 418 from the source and drain gates 414, 416 and separating the mediator gate from the reservoir gate 419. The electric potential applied to the metallic structures in the third metallic layer 413 can be controlled to control the coupling strength between neighbouring quantum charge carrier confinement regions. The confinement regions are typically in the form of electrical potential wells such as the electrical potential well formed beneath an elongate channel 420 in which the mediator gate 418 is partially positioned.

This embodiment differs from that shown in FIG. 1B in that the third metallic structure 403 comprises an additional extension. The third metallic structure 403 which forms the mediator gate 418 comprises a first portion 421, a second portion 422 and a third portion 423. The first portion 421 is positioned in the elongate channel 420 between laterally separated metallic structures 401 within the first metallic layer 411. The second portion 422 and the third portion 423 of the third metallic structure 403 extend substantially parallel to each other and substantially perpendicular to the first portion 421 to an outer region of the device. The second and third portions 422, 423 are first and second extensions of the mediator gate 418 respectively, extending to an outer region of the device for connection to a voltage source. Either or both of the second and third portions 422, 423 may be connected to the voltage source. The third metallic structure, i.e. the mediator gate 418, in this embodiment is 'U' shaped.

Figure 4:
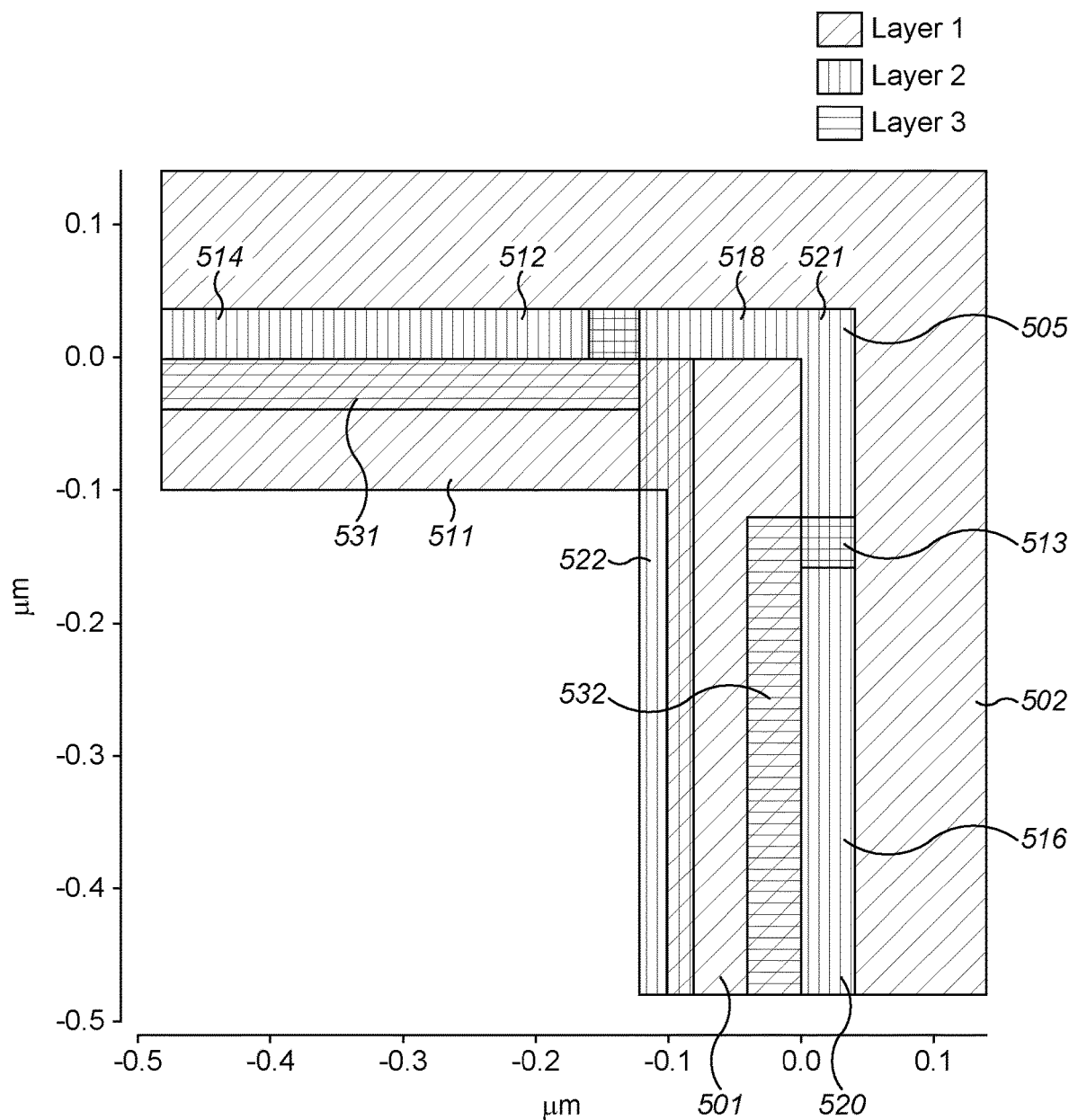
FIG. 4 is a top view of a silicon-based quantum device.

FIG. 4 schematically illustrates a top view of a silicon-based quantum device. A first metallic layer 511 comprises a first metallic structure 501 and a second metallic structure 502. The first and second metallic structures 501, 502 are laterally separated so as to define an elongate channel 520 between them. In this embodiment, the elongate channel 520 has a vertex 505.

A second metallic layer 512 comprises a source gate 514, a drain gate 516 and a mediator gate 518. The source gate 514 is an elongate metallic structure and is positioned at an angle to the drain gate 516 of similar structure. The mediator gate 518 is positioned in the elongate channel 520 and extends around the vertex 505. A first region of the mediator gate 518 is angled with respect to a second region of the mediator gate 518 and the first and second regions are positioned within the elongate channel 520. The first region of the mediator gate 518 is axially aligned with the source gate 514 (horizontally from the perspective of FIG. 4) and the second region of the mediator gate 518 is axially aligned with the drain gate 516 (vertically from the perspective of FIG. 4). In this embodiment, the angle between the source and drain gates 514, 516 and first and second regions of the mediator gate 518 is approximately a right angle. For example, the angle may be between 85 and 95 degrees and is preferably between 89 and 91 degrees. In alternative embodiments, the angle may be approximately 45 degrees or 135 degrees. The mediator gate 518 has a first portion 521 which is positioned within the elongate channel 520 and a second portion 522 which extends from the mediator gate 518 to an outer region of the device.

A third metallic layer 513 comprises a first barrier gate 531 and a second barrier gate 532. The first barrier gate is positioned between the source gate 514 and the mediator gate 518. The second barrier gate is positioned between the mediator gate 518 and the drain gate 516.

Using this device structure, it is possible to mediate interactions around a corner. This allows two-dimensional arrays of quantum dots to be addressed within a device using planar routing. In another embodiment, the device may include a quantum dot gate and an additional barrier gate between the mediator gate and the source and/or drain gate. The elongate quantum dot can be formed with a vertex beneath the mediator gate.

Figure 5:
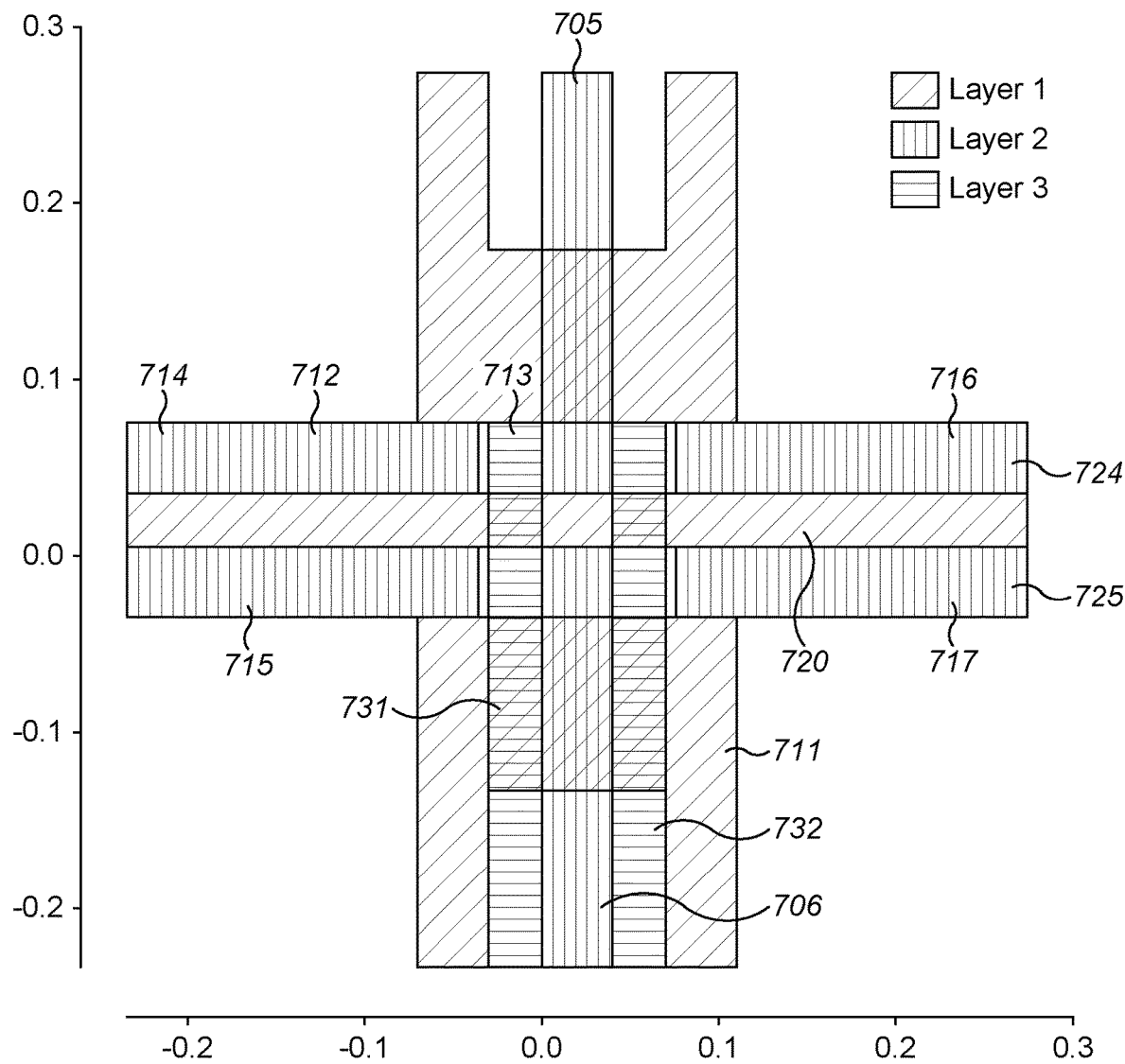
FIG. 5 is a top view of a silicon-based quantum device.

FIG. 5 schematically illustrates a top view of a silicon-based quantum device. A first metallic layer 711 comprises a plurality of metallic structures which together define a first channel 724 and a second channel 725. A second metallic layer 712 comprises first and second quantum dot gates 705, 706, first and second source gates 714, 715, and first and second drain gates 716, 717. A third metallic layer 713 comprises first and second barrier gates 731, 732. The barrier gates 731, 732 are positioned substantially perpendicular to the first and second channels 724, 725 and each barrier gate is partially positioned in each channel.

Accordingly, the first channel 724 includes portions of the first source gate 714, the first quantum dot gate 705 and the first drain gate 716 separated by the first and second barrier gates 731, 732. The second channel 725 includes portions of the second source gate 715, the second quantum dot gate 706 and the second drain gate 716 which are also separated by the first and second barrier gates 731, 732.

In this embodiment, one of the plurality of metallic structures in the first metallic layer 711 forms a horizontal confinement gate 720. The horizontal confinement gate 720 provides a barrier between the first channel 724 and the second channel 725 such that the first and second channels 724, 725 can support linear arrays of quantum dots and/or mediator dots. This device structure therefore provides a mechanism for addressing neighbouring linear arrays of quantum dots using only planar routing.

Figure 6A:
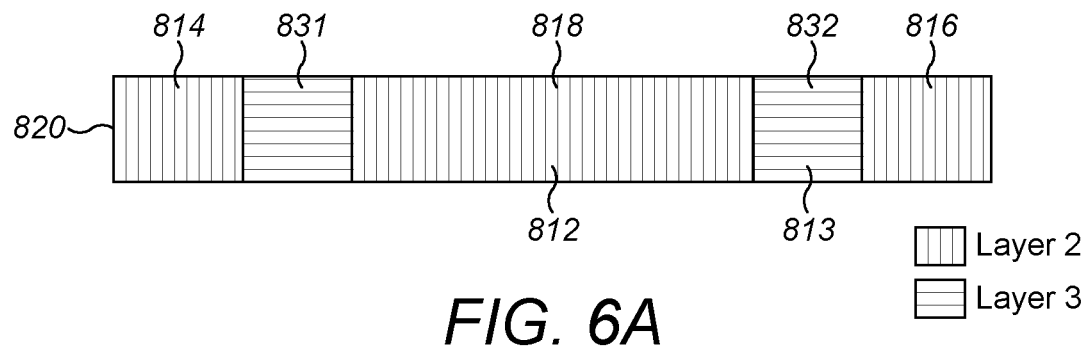
FIG. 6A is a cross-sectional side view of an elongate channel.
Figure 6B:
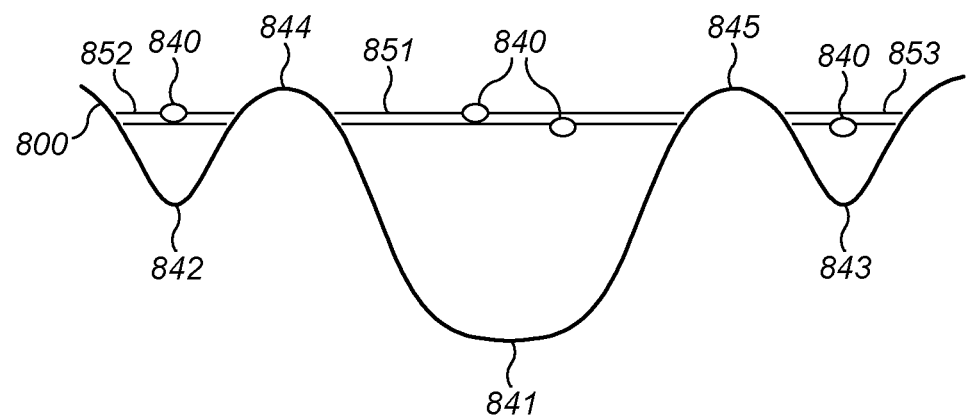
FIG. 6B is a schematic of a potential energy landscape.

FIG. 6B schematically illustrates the electric potential landscape 800 along the elongate channel 820 illustrated in FIG. 6A. FIG. 6A is a cross-sectional view of the elongate channel 820 and depicts a source electrode 814, a mediator electrode 818 and a drain electrode 816 separated by a first barrier electrode 831 and a second barrier electrode 832. The source, drain and mediator electrodes 814, 816, 818 are metallic structures within the second metallic layer 812. The first and second barrier electrodes 831, 832 are metallic structures within the third metallic layer 813. The first metallic layer is positioned each side of the elongate channel and is therefore not shown in the cross-sectional view.

Each of the metallic structures 814, 831, 818, 832, 816 within the elongate channel 820 are configured for connection to corresponding electric potentials. These electric potentials define a potential energy landscape 800 along the elongate channel 820. Lateral confinement of the quantum charge carriers within the elongate channel 820 is achieved using the electric potentials of the confinement electrodes in the first metallic layer. FIG. 6B depicts an exemplary potential energy landscape 800. However, the electric potentials of each of the metallic structures 814, 831, 818, 832, 816 within the elongate channel 820 can be adjusted to modify the potential energy landscape 800 according to requirements.

The potential energy landscape 800 includes first, second and third potential wells 841, 842, 843. The first potential well 841 is formed beneath the mediator electrode 818. The second and third potential wells 842, 843 are formed beneath the source and drain electrodes 814, 816 respectively. In this embodiment, the electric potential of the source and drain electrodes 814, 816 is substantially the same and is less than the electric potential of the mediator electrode 818. Accordingly, the first potential well 841 is deeper than the second and third potential wells 842, 843 and the second and third potential wells 842, 843 are a similar depth.

The number of quantum charge carriers confined within a potential well is related to the depth of the potential well. FIG. 6B illustrates the top-most energy levels 851, 852, 853 within each of the first, second and third potential wells 841, 842, 843 respectively. Quantum charge carriers are illustrated occupying the top-most energy levels 851-853 in one possible configuration.

The potential energy landscape 800 also includes first and second barriers 844, 845 formed beneath the first and second barrier electrodes 831, 832 respectively. The first barrier 844 separates the second potential well 842 from the first potential well 841. The second barrier 845 separates the third potential well 843 from the first potential well 841. The electric potentials of the first and second barrier electrodes 831, 832 can be adjusted to control the tunnel coupling between adjacent potential wells. Control of the tunnel coupling can be used to adjust the quantum charge carrier occupation within each potential well 841-843.

As will be appreciated, a silicon-based quantum device is disclosed along with a method of manufacturing the device. Each of the silicon-based quantum devices as described include a series of metallic layers which are deposited sequentially.

Electrically insulating layers are deposited in between each of the metallic layers in order to electrically separate the metallic layers. Each of the metallic layers comprise a plurality of metallic structures. Each of the metallic structures are configured for connection to respective electric potentials. The relative arrangement of the metallic structures and the electric potentials together define an electrical potential topography which can be used to manipulate quantum charge carriers such as electrons or holes within the device.

The invention claimed is:

1. A silicon-based quantum device comprising:
   a first metallic structure;
   a second metallic structure laterally separated from the first metallic structure;
   an elongate channel defined by the separation between the first and second metallic structures; wherein the elongate channel has a vertex;
   a third metallic structure positioned partially in the elongate channel;
   a fourth metallic structure arranged at a first end of the third metallic structure;
   a fifth metallic structure arranged at a second end of the third metallic structure;
   wherein the first, second, third, fourth and fifth metallic structures are configured for connection to first, second, third, fourth and fifth electric potentials, respectively;
   wherein the first, second, third, fourth and fifth electric potentials are controllable to define an electrical potential well to confine quantum charge carriers in an elongate quantum dot beneath the elongate channel;
   wherein the fourth and fifth electric potentials and the position of the fourth and fifth metallic structures define first and second ends of the elongate channel; respectively;
   wherein the width of the electrical potential well is defined by the position of the first, second and third metallic structures and their corresponding electric potentials; and wherein the length of the electrical potential well is defined by the position of the third, fourth and fifth metallic structures and their corresponding electric potentials; and
   wherein the third electric potential is controllable to adjust quantum charge carrier energy levels in the electrical potential well.

2. The device according to claim 1, wherein the third metallic structure extends around the vertex.

3. The device according to claim 1, wherein the elongate quantum dot extends around the vertex.

4. The device according to claim 1, wherein the first and second metallic structures are arranged in a first metallic layer, wherein the third metallic structure is arranged in a second metallic layer, and wherein the device further comprises an electrically insulating layer between the first metallic layer and the second metallic layer and overlying the first metallic layer.

5. The device according to claim 4, wherein each of the first metallic layer and the second metallic layer comprises a plurality of laterally separated metallic structures.

6. The device according to claim 5, wherein the second metallic layer further comprises a sixth metallic structure configured for connection to a sixth electric potential such that a reservoir of charge carriers can be supported beneath the sixth metallic structure.

7. The device according to claim 5, wherein the second metallic layer further comprises a seventh metallic structure configured for connection to a seventh electric potential such that a quantum dot can be supported beneath the seventh metallic structure.

8. The device according to claim 1, wherein the third metallic structure comprises a first extension, wherein the first extension partially overlies the first metallic structure, and wherein the first extension is configured for connection to the third electric potential.

9. The device according to claim 8, wherein the third metallic structure further comprises a second extension, wherein the second extension partially overlies the first metallic structure, and wherein the first and/or second extension is configured for connection to the third electric potential.

10. A method of manufacturing a silicon-based quantum device, wherein the method comprises:
    depositing a first metallic structure;
    depositing a second metallic structure laterally separated from the first metallic structure such that an elongate channel is defined by the separation between the first and second metallic structures; wherein the elongate channel has a vertex;
    depositing a third metallic structure partially in the elongate channel;
    depositing a fourth metallic structure at a first end of the third metallic structure;
    depositing a fifth metallic structure at a second end of the third metallic structure;
      wherein the first, second, third, fourth and fifth metallic structures are configured for connection to first, second, third, fourth and fifth electric potentials, respectively;
      wherein the first, second, third, fourth and fifth electric potentials are controllable to define an electrical potential well to confine quantum charge carriers in an elongate quantum dot beneath the elongate channel;
      wherein the fourth and fifth electric potentials and the position of the fourth and fifth metallic structures define first and second ends of the elongate channel, respectively;
      wherein the width of the electrical potential well is defined by the position of the first, second and third metallic structures and their corresponding electric potentials; and wherein the length of the electrical potential well is defined by the position of the third, fourth and fifth metallic structures and their corresponding electric potentials; and
      wherein the third electric potential is controllable to adjust quantum charge carrier energy levels in the electrical potential well.

11. The method according to claim 10, wherein depositing the third metallic structure partially in the elongate channel comprises depositing the third metallic structure extending around the vertex.

12. The method according to claim 10, wherein the elongate quantum dot extends around the vertex.

13. The method according to claim 10, wherein the first and second metallic structures are deposited simultaneously as part of a first metallic layer, and wherein the third metallic structure is deposited as part of a second metallic layer following the deposition of the first metallic layer, and wherein the method further comprises depositing a first electrically insulating layer after depositing the first metallic layer and before depositing the second metallic layer, wherein the first electrically insulating layer overlies the first metallic layer.

14. The method according to claim 13, wherein the fourth and fifth metallic structures are deposited simultaneously as part of a third metallic layer, and wherein the method further comprises depositing a second electrically insulating layer after depositing the second metallic layer and before depositing the third metallic layer, wherein the second electrically insulating layer overlies the second metallic layer.

15. A method of operating a silicon-based quantum device, wherein the method comprises:
  applying a first electric potential to a first metallic structure;
  applying a second electrical potential to a second metallic structure, wherein the second metallic structure is laterally separated from the first metallic structure such that an elongate channel is defined by the separation between the first and second metallic structures; wherein the elongate channel has a vertex;
  applying a third electric potential to a third metallic structure, wherein the third metallic structure is positioned partially in the elongate channel;
  applying a fourth electric potential to a fourth metallic structure arranged at a first end of the third metallic structure;
  applying a fifth electric potential to a fifth metallic structure arranged at a second end of the third metallic structure;
  wherein the first, second, third, fourth and fifth metallic structures are configured for connection to first, second, third, fourth and fifth electric potentials, respectively;
  wherein the first, second, third, fourth and fifth electric potentials are controllable to define an electrical potential well to confine quantum charge carriers in an elongate quantum dot beneath the elongate channel;
  wherein the fourth and fifth electric potentials and the position of the fourth and fifth metallic structures define first and second ends of the elongate channel, respectively;
  wherein the width of the electrical potential well is defined by the position of the first, second and third metallic structures and their corresponding electric potentials; and wherein the length of the electrical potential well is defined by the position of the third, fourth and fifth metallic structures and their corresponding electric potentials; and
  controlling the third electric potential to adjust quantum charge carrier energy levels in the electrical potential well.

16. The method according to claim 15, wherein the third metallic structure extends around the vertex.

17. The method according to claim 15, wherein the elongate quantum dot extends around the vertex.

18. The method according to claim 15, wherein the polarity of the first and second electric potentials is opposite to the polarity of the third electric potential.

19. The method according to claim 15, wherein the first electric potential is substantially the same as the second electric potential.

20. The method according to claim 15, wherein the fourth electric potential is substantially the same as the fifth electric potential.

* * * * *